US007434121B2

(12) United States Patent
Astor

(10) Patent No.: US 7,434,121 B2
(45) Date of Patent: Oct. 7, 2008

(54) INTEGRATED MEMORY DEVICE AND METHOD FOR ITS TESTING AND MANUFACTURE

(75) Inventor: Ralph Astor, Dresden (DE)

(73) Assignee: Infineon Technologies Flash GmbH & Co. KG, Dresden (DE)

( * ) Notice: Subject to any disclaimer, the term of this patent is extended or adjusted under 35 U.S.C. 154(b) by 308 days.

(21) Appl. No.: 11/443,493

(22) Filed: May 30, 2006

(65) Prior Publication Data

US 2007/0300106 A1 Dec. 27, 2007

(51) Int. Cl.
 *G11C 29/00* (2006.01)
(52) U.S. Cl. .................... 714/718; 714/731; 714/744
(58) Field of Classification Search ............ 365/189.05, 365/233; 714/731, 724, 718, 744; 324/765
See application file for complete search history.

(56) References Cited

U.S. PATENT DOCUMENTS

| 5,892,776 | A | 4/1999 | Kumakura |
| 6,316,929 | B1 | 11/2001 | Yamaguchi |
| 6,583,642 | B2 | 6/2003 | Huang et al. |
| 6,622,106 | B2 | 9/2003 | Rocchi et al. |
| 7,307,442 | B2 * | 12/2007 | Ong ........................ 324/765 |
| 2002/0003730 | A1 | 1/2002 | Aoki et al. |
| 2002/0048211 | A1 | 4/2002 | Tsujino et al. |
| 2002/0064072 | A1 * | 5/2002 | Ooishi et al. .......... 365/189.05 |
| 2003/0147298 | A1 * | 8/2003 | Ooishi et al. ............... 365/233 |
| 2004/0196052 | A1 | 10/2004 | Okayasu |
| 2005/0041519 | A1 | 2/2005 | Taskin et al. |
| 2005/0050409 | A1 | 3/2005 | Cho |
| 2007/0067687 | A1 * | 3/2007 | Ong ........................ 714/731 |
| 2007/0168808 | A1 * | 7/2007 | Ong ........................ 714/731 |

FOREIGN PATENT DOCUMENTS

| DE | 32 29 749 A1 | 2/1984 |
| DE | 100 59 667 A1 | 12/2001 |

* cited by examiner

*Primary Examiner*—David Ton
(74) *Attorney, Agent, or Firm*—Slater & Matsil, L.L.P.

(57) ABSTRACT

An integrated memory device includes an array of memory cells for storing data, a memory cell selector operationally connected to the array for selecting at least one memory cell of the array, a data interface adapted to store data provided to the data interface in a selected memory cell and to provide data stored in a selected memory cell to the data interface for retrieval, and a control circuit operationally connected to the memory cell selector and the data interface.

24 Claims, 3 Drawing Sheets

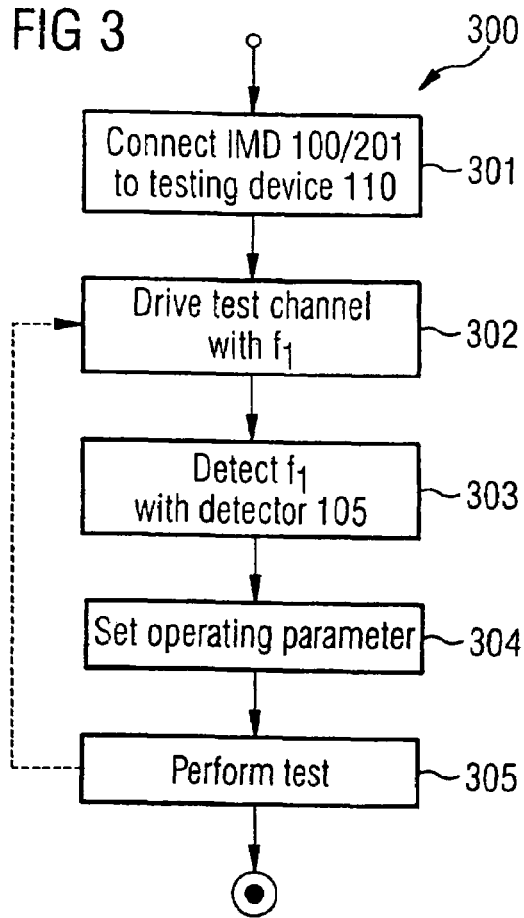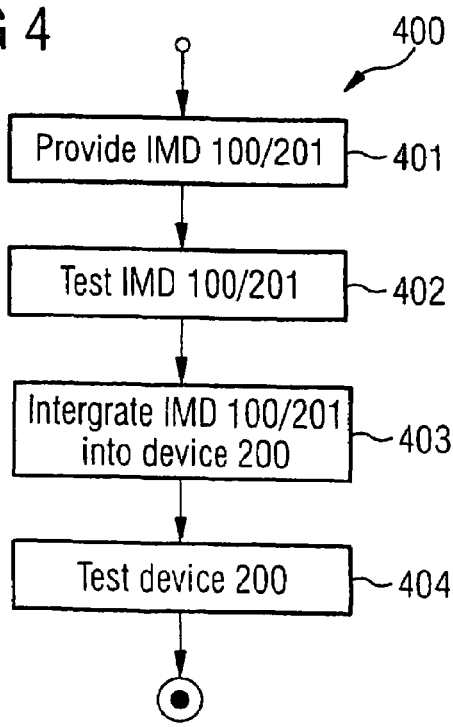

INTEGRATED MEMORY DEVICE AND METHOD FOR ITS TESTING AND MANUFACTURE

TECHNICAL FIELD

The invention relates to an integrated memory device comprising an array of memory cells, a memory selector, a data interface and a control circuit. The invention further relates to a method for testing and manufacturing an integrated memory device.

BACKGROUND

Integrated memory devices, in particular non-volatile memory devices, are used in a variety of devices and applications. For example, memory cards or so-called memory sticks comprise one or a multiplicity of integrated memory devices for storing and exchanging data between mobile and stationary computers. Many consumer electronic devices also comprise integrated memory devices for storing firmware or user data and settings. In particular, integrated non-volatile memory devices are preferably used for data storage in mobile devices due to their mechanical and electrical robustness.

During manufacturing, integrated memory devices run through a multiplicity of tests for ensuring the proper operation of an array of memory cells, data and control interfaces and control circuitry of the integrated memory device. As integrated memory devices become more widespread and have an ever increasing capacity, testing requires a significant amount of time. Consequently, it is desirable to test as many integrated memory devices in parallel as possible. One way of allowing testing of more integrated memory devices in parallel is to reduce the number of channels of a testing device used during testing.

Consequently there is a need for integrated memory devices and methods for testing and manufacturing integrated memory devices that simplify or enhance testing.

SUMMARY OF THE INVENTION

According to a first aspect of the invention, an integrated memory device includes an array of memory cells for storing data, a memory cell selector operationally connected to the array for selecting at least one memory cell of the array, a data interface adapted to store data provided to the data interface in a selected memory cell and to provide data stored in a selected memory cell to the data interface for retrieval, and a control circuit operationally connected to the memory cell selector and the data interface. The control circuit includes a signal modulator adapted to generate a clock signal of different frequencies and, in a test mode of the integrated memory device, to provide a clock signal with a predefined clock frequency associated with a predefined operating parameter to a connection of the data interface.

By providing a clock signal with a predefined clock frequency associated with a predefined operating parameter to a connection of the data interface, a currently used operating parameter can be detected by a tester connected to the integrated memory device using a single pin.

According to a second aspect of the invention, an integrated memory device includes an array of memory cells for storing data, a memory cell selector operationally connected to the array for selecting at least one memory cell of the array of memory cells, a data interface adapted to store data provided to the data interface in a selected memory cell and to provide data stored in a selected memory cell to the data interface for retrieval, and a control circuit operationally connected to the memory cell selector and the data interface. The integrated memory device also includes a frequency detector adapted to detect the frequency of a clock signal provided to a predefined connection of the data interface and, in a test mode of the integrated memory device, to set an operating parameter associated with a detected clock signal frequency.

By providing an integrated memory device with a control circuit comprising a frequency detector adapted to detect a frequency of a clock signal provided and to set an operating parameter associated with a detected clock signal frequency, the operating parameter of an integrated memory device used, for example for testing, can be set by a tester using a single pin.

According to advantageous embodiments of the invention, the data interface includes a plurality of data or address lines and is adapted to operate in a first interface mode, in which a first group of data or address lines is used as data bus having a first bus width, and, in a second interface mode, in which a second group of data or address lines is used as data bus having a second bus width. A clock signal having a first frequency is provided, if the data interface is operated in the first interface mode, and a clock signal having a second frequency is provided, if the data interface is operated in a second interface mode.

By retrieving and setting a bus width of the data interface by means of an associated frequency, the bus width of the integrated memory device can be reduced or enlarged by a controller connected to it without connecting all data or address lines of the data interface first.

According to a further embodiment of the present invention, the integrated memory device includes a control circuit with a signal modulator adapted to generate clock signals of different frequency and a frequency detector adapted to detect a frequency of a clock signal. By providing both, a signal modulator and a frequency detector, setting and retrieving of operating parameters can be performed by the same integrated memory device.

According to a further advantageous embodiment, the clock signal detected by the frequency detector and the clock signal provided by the signal modulator are provided to the same connection of the data interface and the clock provided to the data interface for detection overwrites the clock signal provided to the data interface by the signal generator.

By providing both incoming and outgoing clock signals to the same connection of the data interface, only a single connection for connecting the clock signal to a tester is required.

According to a third aspect of the present invention, a method for testing an integrated memory device is provided. A data interface of an integrated memory device is connected to a testing device. A test channel of the testing device is driven with a clock signal with a predefined frequency associated with a predefined test operating parameter. The frequency of the clock signal is detected by a frequency detector of the integrated memory device. An operating parameter is set in accordance with the detected frequency and a test is performed in accordance with the set operation parameter.

According to an advantageous embodiment of the third aspect, in the step of connecting the data interface, only a first group of data or address lines of the data interface is connected to the testing device, in the step of setting the operating parameter, the data interface is switched in the first interface mode, in which only the first group of data or address lines is used as a data bus with a first bus width, and in the step of performing the test, test data is transferred from or to the integrated memory device using the first data width.

By switching the data interface into a first interface mode in which only a first group of data or address lines is used, the bus width of the data interface used for communicating with a testing device can be reduced and, thus, the number of test channels of the data tester can be reduced.

According to a fourth aspect of the present invention, a method for manufacturing an integrated memory device is provided. The method comprises the steps of providing an integrated memory device in accordance with the first or second aspect of the present invention, testing the integrated memory device, and encapsulating the integrating memory device into a memory card device or the electronic component comprising an external data interface, wherein connections used for providing a clock signal during testing are inaccessible through the internal data interface.

Further details and embodiments of the present invention are described in the patent claims.

BRIEF DESCRIPTION OF THE DRAWINGS

Hereafter, exemplary embodiments of the invention are explained in more detail with reference to the following figures:

FIG. 3 shows a flow diagram of a method for testing an integrated memory device; and FIG. 4 shows a flow diagram of a method for manufacturing an integrated memory device.

The following list of reference symbols can be used in conjunction with the figures:

| | |
|---|---|
| 100 | integrated memory device |
| 101 | array (of memory cells) |
| 102 | memory cells |
| 103 | memory cell selector |
| 104 | control circuit |
| 105 | frequency detector |
| 106 | clock input |
| 107 | data interface |
| 108 | first group (of data and address lines) |
| 109 | second group (of data and address lines) |
| 110 | testing device |
| 200 | memory card device |
| 201 | integrated memory device |
| 202 | external data interface |
| 203 | address line |
| 204 | data line |
| 205 | third group (of data lines) |
| 206 | signal generator |
| 207 | clock output |
| 300 | method for testing an integrated memory device |
| 301 to 305 | method steps |
| 400 | method for manufacturing an integrated memory device |
| 401 to 404 | method steps |

DETAILED DESCRIPTION OF ILLUSTRATIVE EMBODIMENTS

Figure 1:
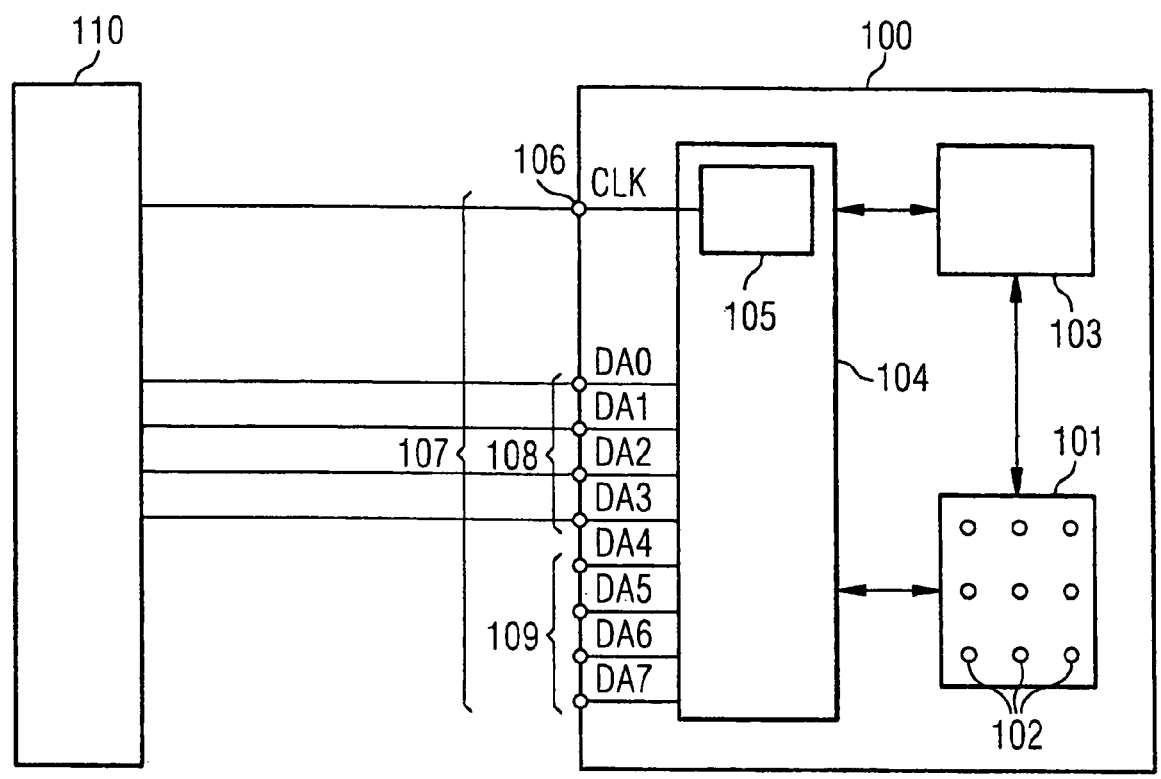
FIG. 1 shows a first integrated memory device in accordance with a first embodiment.

FIG. 1 shows a block diagram of an integrated memory device 100. The integrated memory device 100 comprises an array 101 of memory cells 102. The array 101 is controlled by a memory cell selector 103, which is adapted to select one or several memory cells 102 of the array 101. The integrated memory device 100 further comprises a control circuit 104 operationally connected to the memory cell selector 103 and the array 101.

For example, the integrated memory device 100 may be a flash EEPROM memory device comprising a plurality of floating gate memory cells or nitride ROM memory cells (NROM). The memory cell selector 103 may comprise circuitry for selecting a column and a row of the array 101, for example an address decoder adapted to select the column of the array 101 by means of an associated word line and a bit line connected to a row of the array 101 by means of a multiplexer. Different types and set-ups of integrated memory devices 100 are known to a person skilled in the art of semiconductor memory devices, which comprise, among others, so-called NOR-type and NAND-type arrays 101, for example. The present invention is equally applicable to all types of integrated memory devices 100 having a built-in or external control circuit 104.

In the embodiment shown in FIG. 1, the control circuit 104 comprises a frequency detector 105 connected to a clock input 106 of a data interface 107. The data interface 107 further comprises a first group 108 of combined data and address lines DA0 to DA3 and a second group 109 of combined data and address lines DA4 to DA7. The data and address lines DA0 to DA7 of the first and second groups 108 and 109 are also connected to the control circuit 104 of the integrated memory device 100.

In a test mode, for example, during a so-called waver test during manufacturing of the integrated memory device 100, a testing device 110 is connected to the clock input 106 and the data and address lines DA0 to DA3 of the first group 108. In order to test the array 101 of memory cells 102 without connecting all eight data and address lines DA0 to DA7 of the first and second groups 108 and 109 of the data interface 107, the control circuit 104 is switched into a 4-bit mode of operation. This is done by providing a clock signal with a first frequency, for example a frequency of 4 kHz to the clock input 106 of the data interface 107. The clock signal may be provided by the testing device 110 or, alternatively, by a fixed clock signal generator used in the testing stage.

During testing, the frequency detector 105 detects the clock signal with the first frequency provided to the clock input 106. In response, the control circuit 104 switches the data interface 107 into a first interface mode, in this case a 4-bit interface mode, by deactivating the second group 109 of data and address lines DA4 to DA7.

Optionally, the control circuit 104 may confirm the currently selected interface mode by generating a clock signal to be output to the data interface 107. For example, a signal modulator not shown in FIG. 1 may generate a clock signal having a frequency associated with the 4-bit bus width. The generated clock signal may be provided to the same clock input 106 or a different pin of the data interface 107, for example the first data and address line DA0 or an additional connection of the data interface 107 not shown in FIG. 1.

After configuring the data interface 107 and the control circuit 104 to use a 4-bit mode, the testing device 110 can send addresses and data in a 4-bit format to the integrated memory device 100 for testing. After completion of the device test, the testing device 110 may send a second clock signal with a second frequency to the clock input 106 to enable the full data interface 107 comprising the first group 108 and the second group 109 of data and address lines DA0 to DA7. For example, the data interface 107 may be switched into its 8-bit mode of operation for subsequent testing of the data interface 107 itself for a further stage of testing the integrated memory device 100.

Figure 2:
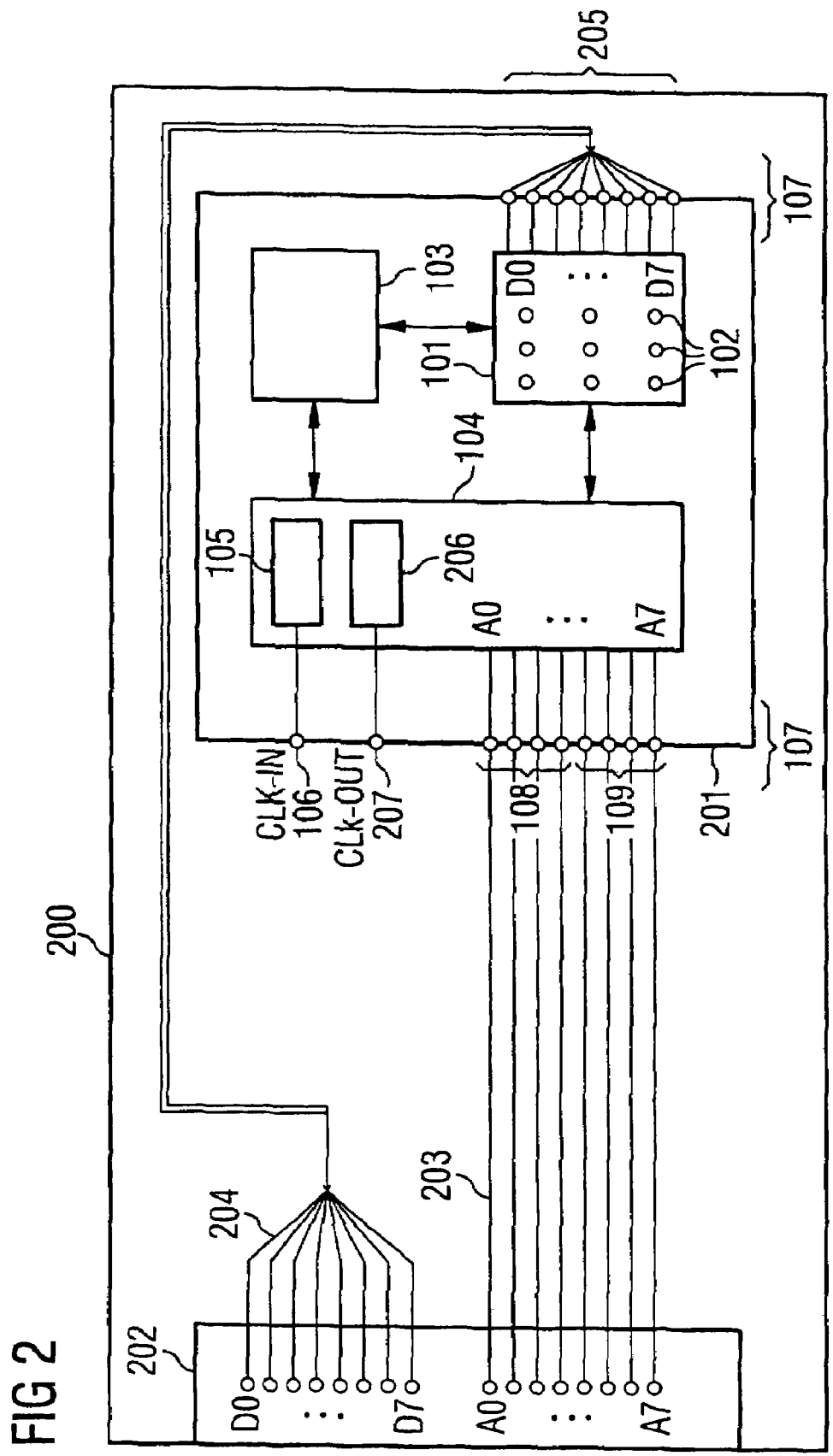
FIG. 2 shows a second integrated memory device in accordance with a second embodiment.

FIG. 2 shows a memory card device 200 comprising an integrated memory device 201 and an external data interface 202. The memory card device 200 may be a USB stick, a secure digital (SD), a compact flash (CF) card or any other device with an built-in integrated memory device 201.

Address lines 203 connect the external interface 202 with a first and second group 108 and 109 of address lines A0 to A3 and A4 to A7 of a internal data interface 107 of the integrated memory device 201. Data lines 204 connect the external data interface 202 with a third group 205 of data lines of the internal data interface 107.

The integrated memory device 201 comprises an array 101 of memory cells 102, a memory cell selector 103 and a control circuit 104. The control circuit 104 comprises a frequency detector 105 and a signal generator 206. The frequency detector 105 is connected to a clock input 106 of the data interface 107 and the signal generator 206 is connected to a clock output 207 of the data interface 107. Neither the clock input 106 nor the clock output 207 of the data interface 107 are connected to the external data interface 202 of the memory card device 200. Consequently, the clock input 106 and the clock output 207 are only accessible at a testing stage before the memory card device 200 is sealed.

Alternatively or in addition, the clock input 106 and the clock output 207 may be deactivated after the completion of a testing procedure, for example by destroying a fuse of the integrated memory device 201 or by setting of a predefined value in a so-called one time programming (OTP) register of the integrated memory device 201.

By driving the clock input 106 with a predefined frequency detected by the frequency detector 105, operating parameters of the control circuit 104 can be set for testing. Inversely, by generating a clock signal with a predefined frequency through the clock generator 206 and providing it to the clock output 207, a testing device 110 connected to it can retrieve currently set operating parameters of the integrated memory device 201.

FIG. 3 shows a flowchart of a method 300 for testing an integrated memory device 100 or 201.

In a first step 301, the data interface 107 of the integrated memory device 100 or 201 is connected to a testing device 110. Not all pins of the data interface 107 need to be connected to a testing channel of the testing device 110. For example, only the first group 108 of data and address lines of the data interface 107 may be connected to testing channels of the testing device 110. The clock input 106 may be connected to a fixed frequency source providing a clock signal with a first clock frequency. The second group 109 of data and address lines may not be connected at all during the test.

In a step 302, at least one test channel of the testing device 110 is driven with a clock signal with a predefined first frequency $f_1$. For example, the first clock signal may be a clock signal with a frequency $f_1$ of 4 kH. The test channel can be driven either by the testing device 110 or the signal generator 206 of the integrated memory device 201. In the described example, it is assumed that the testing channel is driven by the testing device 110.

In a step 303, the frequency of the clock signal is detected by the frequency detector 105. The frequency detector 105 may be integrated into the control circuit 104 of the integrated memory device 100 or 201 or part of the testing device 110, depending on the direction of the data flow. In the presented example, the testing device 110 provides the first clock signal to the integrated memory device 100 or 201 and the frequency detector 105 of the integrated memory device 100 or 201 detects the frequency of the provided clock signal.

Detecting the frequency of the provided clock signal may be performed by comparing the clock signal provided via the clock input 106 with an internal or an external clock source of the integrated memory device 100.

In a step 304, an operating parameter is set in accordance with the detected frequency $f_1$. For example, a bus width parameter of the control circuit 104 may be set. In the given example, the bus width of the data interface 107 is restricted to the four data and address lines of the first group 108. The second group 109 of data and address lines is deactivated.

Other operating parameters that may be changed in accordance with a detected frequency $f_1$ comprise the interface bus speed or a control circuit operating speed and further operating parameters used in a specific test procedure. For example, a predefined test pattern provided by the control circuit 104 may be activated by means of providing and detecting a clock signal with a predefined first frequency $f_1$.

In a step 305, a predefined test procedure is performed in accordance with the set operating parameter. For example, data patterns provided to the first group of data and address lines 108 of the data interface 107 may be programmed into memory cells 102 of the array 101. Subsequently, the programmed values may be read out via the first group 108 or the third group 205 of data lines to the testing device 110 and compared with the previously programmed value.

Testing may also comprise the setting of one time programmable register values of the integrated memory device 100 or 201 during individualization of the integrated memory device 100 or 201.

After completing the test performed in step 305 the method 300 may end or may continue in step 302 with setting of another operating parameter of the integrated memory device 100 or 201. For example, the bus width of the data interface 107 may be changed to include the first and second groups 108 and 109 of data and address lines for a subsequent test of the data interface 107 itself or for normal operation.

FIG. 4 shows a method 400 of manufacturing an integrated memory device 100 or 201.

In a first step 401, an integrated memory device 100 or 201 is provided. For example, a wafer comprising a plurality of integrated memory devices 100 or 201 may be provided. Alternatively, the wafer may already be cut into individual memory devices 100 or 201.

In a step 402, the integrated memory device 100 or 201 is tested. For testing purposes, pins of the data interface 107 of the integrated memory device 100 or 201 are connected with testing channels of a testing device 110. For example, contact pins of a testing device 110 may be placed on a wafer with contact areas for connecting the clock input 106 and a first group 108 of data and address lines. One or several tests in accordance with the method presented in FIG. 3 can be performed during step 402.

In a step 403, the integrated memory device 100 or 201 is integrated into a memory card device 200 or another electronic component comprising an external interface 202. For example, a wafer comprising a multiplicity of integrated memory devices 100 or 201 may be cut into the individual integrated memory devices 100 or 201, which are placed in a so-called TSOP housing or a memory card 200.

During integration, only those connections of the data interface 107 that are used in a normal user mode are connected to the external data interface 202 of the memory card 200 or the other electronic component comprising the integrated memory device 100 or 201. In particular, connections 106 and 207 of the data interface 107, which are only used in a test mode, are not connected to the external interface 202.

In an optional step 404, further tests of the memory card device 200 may be performed. For example the external interface 202 may be tested.

If the tests performed in steps 402 and 404 are completed successfully, and after potentially setting and storing parameters for operating the integrated memory device 100 or 201 in a user mode, the memory card device 200 or the other electronic component is ready for use and the method 400 presented in FIG. 4 ends.

Many variations of the integrated memory device 100 and 201 and the method 300 and 400 are possible and will be obvious to a person skilled in the art. For example, a further testing channel of the testing device 110 can be saved, if both the clock input 106 and the clock output 207 are connected to a single connection of the data interface 107.

In order to allow a two-way communication between the integrated memory device 100 or 201 and the testing device 110, the signal generator 206 of the integrated memory device 100 or 201 may drive the clock output 207 with a current of 1 mA. Consequently, as long as the testing channel connected to the clock output 207 is open or has a high impedance at the testing device 110, the frequency of the clock signal generated by the signal generator 206 can be detected by the testing device 110. If, however, the testing device 110 is to set an operating parameter by transmitting a clock signal with a predefined frequency to the combined clock input 106 and clock output 207, it may drive the testing channel connected to the clock input 206 with a current of 20 mA, overwriting the signal generated by the signal generator 206.

Alternatively, a combined clock input 106 and clock output 207 may be used in a time division multiplexed manner, for example, by activating the signal generator 206 for a first period of time immediately after activating the integrated memory device 100 or 201, for example for 5 ms, and by deactivating the signal generator 206 and activating the frequency detector 105 for another time period, for example for 5 ms following the first time period.

A further testing channel and connection of the data interface 107 can be saved by using one of the data and address lines of the first group 108 for transmitting the clock signal to and from the memory card device 100 or 201.

Memory card devices or other electronic components may comprise one or several integrated memory devices for storing large amounts of data. If multiple integrated memory devices are encapsulated in a memory card device, the memory card device may comprise an additional control circuit for controlling access to the individual integrated memory devices.

In addition or alternatively, a controller may be used to interconnect an external data interface with a first bus width with an internal data interface having a different bus width. For example, a memory card having an external bus width of 16 or 32 bits may be connected in parallel to two or four integrated memory devices having an internal bus width of eight bit.

What is claimed is:

1. An integrated memory device, comprising:
   an array of memory cells for storing data;
   a memory cell selector operationally coupled to the array for selecting at least one memory cell of the array;
   a data interface adapted to store data provided to the data interface in a selected memory cell and to provide data stored in a selected memory cell to the data interface for retrieval; and
   a control circuit operationally coupled to the memory cell selector and the data interface, the control circuit comprising a signal modulator adapted to generate clock signals of different frequencies and, in a test mode of the integrated memory device, to provide a clock signal with a predefined clock frequency associated with a predefined operating parameter to a connection of the data interface.

2. The integrated memory device according to claim 1, wherein:
   the data interface comprises a plurality of data or address lines and is adapted to operate in a first interface mode, in which a first group of data or address lines is used as data bus having a first bus width, and, in a second interface mode, in which a second group of data or address lines is used as data bus having a second bus width; and
   the signal modulator is adapted to provide a clock signal of a first frequency, if the data interface is operated in the first interface mode, and to provide a clock signal of a second frequency, if the data interface is operated in the second interface mode.

3. The integrated memory device according to claim 1, wherein:
   the data interface or the control circuit is adapted to operate with a first operating speed and with a second operating speed; and
   the signal modulator is adapted to provide a clock signal of a first frequency, if the data interface or control circuit is operated with the first operating speed, and to provide a clock signal of a second frequency, if the data interface or control circuit is operated with the second operating speed.

4. The integrated memory device according to claim 1, wherein the control circuit is adapted to activate the signal modulator for a predefined period of time of operation.

5. The integrated memory device according to claim 4, wherein the control circuit is adapted to activate the signal modulator for a fixed period after activating the integrated memory device.

6. An integrated memory device, comprising:
   an array of memory cells for storing data;
   a memory cell selector operationally connected to the array for selecting at least one memory cell of the array;
   a data interface adapted to store data provided to the data interface in a selected memory cell and to provide data stored in a selected memory cell to the data interface for retrieval; and
   a control circuit operationally connected to the memory cell selector and the data interface, the control circuit comprising a frequency detector adapted to detect a frequency of a clock signal provided to a predefined connection of the data interface and, in a test mode of the integrated memory device, to set operating parameters associated with a detected clock signal frequency.

7. The integrated memory device according to claim 6, wherein:
   the data interface comprises a plurality of data or address lines and is adapted to operate in a first interface mode, in which a first group of data or address lines is used as data bus having a first bus width, and in a second interface mode, in which a second group of data or address lines is used as data bus having a second bus width; and
   the control circuit is adapted to switch the data interface into the first interface mode, if the frequency detector detects a clock signal of a first frequency, and to switch the data interface into the second interface mode, if the frequency detector detects a clock signal of a second frequency.

8. The integrated memory device according to claim 6, wherein:
the data interface or the control circuit is adapted to operate with a first operating speed and with a second operating speed; and
the control circuit is adapted to switch the data interface or control circuit into the first operating speed, if the frequency detector detects a clock signal of a first frequency, and to switch the data interface or the control circuit into the second operating speed, if the frequency detector detects a clock signal of a second frequency.

9. The integrated memory device according to claim 6, wherein the frequency detector is adapted to detect the frequency of the clock signal within a predefined period of time of operation.

10. The integrated memory device according to claim 9, wherein the frequency detector is adapted to detect the frequency of the clock signal for a fixed period after activating the integrated memory device.

11. The integrated memory device according to claim 6, wherein the control circuit further comprises a signal modulator adapted to generate clock signals of different frequencies and, in a test mode of the integrated memory device, to provide a clock signal with a predefined clock frequency associated with a predefined operating parameter to a connection of the data interface.

12. The integrated memory device according to claim 11, wherein:
the clock signal detected by the frequency detector and the clock signal provided by the signal modulator are provided to the same connection of the data interface; and
the clock signal provided to the data interface for detection overwrites the clock signal provided to the data interface by the signal generator.

13. The integrated memory device according to claim 11, wherein:
the clock signal detected by the frequency detector and the clock signal provided by the signal modulator are provided to the same connection of the data interface; and
during a first period of operation the signal modulator provides a clock signal to the data interface and during a second period of operation the frequency detector detects the frequency of the clock signal provided to the data interface.

14. The integrated memory device, comprising:
interface means for inputting and outputting addresses and data to the integrated memory device;
retrieval means for retrieving a data value of a provided storage address of the integrated memory device;
storage means for storing a provided data value at a provided storage address;
control means for setting and retrieving test parameters of the integrated memory device;
modulator means for generating a clock signal with a predefined frequency and outputting it to the interface means; and
detector means for detecting a clock frequency of a clock signal provided to the interface means;
wherein, in a test mode of the integrated memory device:
the control means is adapted to set a test parameter associated with a predefined clock frequency detected by the detector means; and
the modulator means is adapted to generate a clock signal with a predefined clock frequency associated with a test parameter retrieved from the control means.

15. The integrated memory device according to claim 14, wherein the test parameters comprise at least one of an interface address bus width, an interface data bus width, an interface bus speed, a control circuit operating speed, an array size, a control circuit fault code, or start or stop codes for activation or deactivation of predefined operations, in particular program, read or erase operations used in a built-in self test or outputting of status information.

16. The integrated memory device according to claim 14, further comprising deactivation means for deactivating the control means, the modulator means or the detector means.

17. A method for testing an integrated memory device, the method comprising:
connecting a data interface of a integrated memory device to a testing device;
driving a test channel of the testing device with a clock signal with a predefined first frequency associated with a predefined first operating parameter;
detecting the frequency of the clock signal by a frequency detector;
setting an operating parameter in accordance with the detected frequency; and
performing a test in accordance with the set operating parameter.

18. The method according to claim 17, wherein the clock signal is generated by the integrated memory device and detected by the testing device.

19. The method according to claim 17, wherein the clock signal is generated by the testing device and detected by the integrated memory device.

20. The method according to claim 19, wherein:
in the step of connecting the data interface, only a first group of data or address lines of the data interface is connected to the testing device;
in the step of setting the operating parameter, the data interface is switched into a first interface mode, in which only the first group of data or address lines is used as a data bus with a first bus width; and
in the step of performing the test, test data is transferred from or to the integrated memory device using the first bus width.

21. The method according to claim 17, further comprising, after performing a test in accordance with the set operating parameter:
driving the test channel of the testing device with a clock signal with a predefined second frequency associated with the predefined operating parameter;
detecting the frequency of the clock signal by a frequency detector; and
setting an operating parameter in accordance with the detected frequency.

22. A method for manufacturing an integrated memory device, the method comprising:
providing an integrated memory device comprising:
an array of memory cells for storing data;
a memory cell selector operationally coupled to the array for selecting at least one memory cell of the array;
a data interface adapted to store data provided to the data interface in a selected memory cell and to provide data stored in a selected memory cell to the data interface for retrieval; and
a control circuit operationally coupled to the memory cell selector and the data interface, the control circuit comprising a signal modulator adapted to generate clock signals of different frequencies and, in a test mode of the integrated memory device, to provide a clock signal with a predefined clock frequency associated with a predefined operating parameter to a connection of the data interface;

providing the integrated memory device with a data interface comprising at least one connection for providing the clock signal from or to the memory device;

testing the integrated memory device using the connection for providing a clock signal of the data interface; and encapsulating the integrated memory device into a memory card device or electronic component comprising an external data interface;

wherein, the connection used for providing a clock signal during testing is inaccessible through the external data interface.

23. The method according to claim 22, wherein the at least one connection for providing a clock signal is physically isolated from the external data interface.

24. The method according to claim 22, wherein the at least one connection for providing a clock signal is deactivated by storing a control value in a non-volatile memory element of the integrated memory device.

* * * * *